United States Patent [19]

Tamura et al.

[11] Patent Number: 4,792,537
[45] Date of Patent: Dec. 20, 1988

[54] DIELECTRIC CERAMIC COMPOSITION FOR HIGH FREQUENCIES

[75] Inventors: Hiroshi Tamura, Kyoto; Djuniadi A. Sagala, Nagaokakyo, both of Japan

[73] Assignee: Murata Manufacturing Co., Ltd., Japan

[21] Appl. No.: 25,508

[22] Filed: Mar. 13, 1987

Related U.S. Application Data

[63] Continuation-in-part of Ser. No. 884,017, Jul. 10, 1986, abandoned.

[30] Foreign Application Priority Data

Jul. 13, 1985 [JP] Japan .................. 60-154726
Apr. 11, 1986 [JP] Japan .................. 61-84465
Apr. 30, 1986 [JP] Japan .................. 61-101518

[51] Int. Cl.⁴ .............. C04B 35/04; C04B 35/10; C04B 35/14
[52] U.S. Cl. .............. 501/118; 501/119; 501/121; 501/122; 501/128
[58] Field of Search .............. 501/118, 119, 121, 122, 501/153, 128

[56] References Cited

FOREIGN PATENT DOCUMENTS 53-84199 7/1978 Japan .................. 501/153
61-26572 2/1986 Japan .................. 501/153
288630 12/1970 U.S.S.R. .................. 501/153
773027 10/1980 U.S.S.R. .
1023115 3/1966 United Kingdom .................. 501/153

Primary Examiner—Mark L. Bell
Assistant Examiner—Ann M. Knab
Attorney, Agent, or Firm—Ostrolenk, Faber, Gerb & Soffen

[57] ABSTRACT

A dielectric ceramic composition for high frequencies consisting essentially of a basic composition expressed by the general formula:

$$xMgO\text{—}yAl_2O_3\text{—}zSiO_2$$

wherein x, y and z are mole percentage of the respective components, $x+y+z=100$, $65 \leq x \leq 77$, $1 \leq y \leq 15$, and $8 \leq z \leq 34$ and an exclusive additive of 0.1 to 10.0 weight % of $Li_2O$. The basic composition has a set of x, y and z falling within an area defined by a polygon ABCD encompassed by the points A, B, C and D in FIG. 1, the sets of x, y and z at the vertexes A, B, C and D of said polygon being as follows:

| | x | y | z |
|---|---|---|---|
| A | 77 | 15 | 8 |
| B | 65 | 15 | 20 |
| C | 77 | 1 | 22 |
| D | 65 | 1 | 34 |

1 Claim, 3 Drawing Sheets

DIELECTRIC CERAMIC COMPOSITION FOR HIGH FREQUENCIES

This application is a contnnuation in part application of U.S. application Ser. No. 884,017 filed July 10, 1986 now abandoned.

FIELD OF THE INVENTION

This invention relates to a dielectric ceramic composition for high frequencies and, more particularly, a dielectric ceramic composition useful as a materaal for circuit boards and supporting members which are employed in electronic devices designed for operation in the microwave frequency region, such as, for example, microwave integrated circuits, dielectric resonators, microwave filters and the like.

BACKGROUND OF THE INVENTION

In high frequency circuit elements such as microwave integrated circuits, low dielectric materials are frequently employed for insulation of circuit components. For example, a microwave resonator generally comprises, as shown in FIG. 2, a dielectric resonator 1, a ceramic substrate 3 and a supporting member 2 of a low dielectric material interposed between them. To make a complete assembly, the entire unit is encapsulated in a metal case 5. Electromagnetic energy is supplied to the resonator 1 by strip lines 4 deposited on the substrate and electromagnetically coupled to the resonator by electromagnetic field H.

In such microwave devices, the unloaded Q of the resonant system is decreased by conductor loss. Thus, the smaller the leakage of the electric field through the supporting member, the greater the unloaded Q value of its resonant system. For this reason, a material for the supporting member is required to have a lower dielectric constant and have a smaller dielectric loss factor (tan δ). Up to now, forsterite is most widely used as a material for supporting members since it has a low dielectric constant of 6.5. However, the Q value of the forsterite is about 3000 at 10 GHz, so that there is an increasing demand for development of dielectric materials with a higher Q value.

On the other hand, alumina ceramics which are mainly used as a material for high frequency circuit boards have a high flexural strength of about 3000 kg/cm$^2$, but they have a relatively high dielectric constant of about 9.0 to 9.5. When strip lines with a high impedance are to be formed on the alumina substrate, it is required to make the width of the strip lines small (generally, less than 1 μm). This causes broken strip lines, resulting in an increase in the number of inferior microwave devices.

The impedance of strip lines formed on the ceramic substrate with a given thickness is, very roughly speaking, in inverse proportion to the width of the strip lines and the dielectric constant of the substrate. Thus, the impedance of the strip lines can be increased by use of materials with a lower dielectric constant, instead of the reduction in width of the strip lines. However, the low dielectric materials of the prior art such as, for example, forsterite (ε: 6.5) and steatite (ε: 5.5-7.5) can lead to a decrease in reliability of the microwave devices since their flexural strengths are less than 1500 kg/cm$^2$ and approximately less than one-half of that of alumina ceramics.

SUMMARY OF THE INVENTION

It is therefore an object of the present invention to provide a dielectric ceramic composition for high frequencies which has a dielectric constant lower than that of alumina ceramics, and a flexural strength higher than that of forsterite.

Another object of the present invention is to provide a dielectric ceramic composition for high frequencies which has much higher Q value than forsterite.

Definitely speaking, the composition of the present invention is restricted in the region where the following characteristics can be obtained. That is, the dielectric constant is lower than 6.0, the Q value at 10 GHz is higher than 10,000, and the flexural strength is higher than 2000 kg/cm$^2$.

According to the present invention these and other objects are achieved by incorporating 0.1 to 10.0 wt % of $Li_2O$ into a basic composition expressed by the general formula:

$$xMgO\text{-}yAl_2O_3\text{—}zSiO_2$$

wherein x, y and z are mole percentage of the respective components, $x+y+z=100$, $65 \leq x \leq 77$, $1 \leq y \leq 15$, and $8 \leq z \leq 34$, said basic composition having a set of x, y and z falling within an area defined by a polygon ABCD encompassed by the points A, B, C and D in FIG. 1, the sets of x, y and z at the vertexes A, B, C and D of said polygon being as follows:

|   | x  | y  | z  |
|---|----|----|----|
| A | 77 | 15 | 8  |
| B | 65 | 15 | 20 |
| C | 77 | 1  | 22 |
| D | 65 | 1  | 34 |

The reasons why the mole percentages of the three components of the basic composition, i.e., x, y and z have been limited as being within the above range are as follows: If the content of MgO is less than 65 mole %, the Q value becomes lowered, and a well sintered body is hard to obtain. If the content of MgO exceeds 77%, the dielectric constant becomes high. Thus, the content of MgO has been limited to a value ranging from 65 to 77 mole %. If theccontent of $Al_2O_3$ is less than 1 mole %, the Q value becomes lowered. If the content of $Al_2O_3$ exceeds 15 mole %, good sintered bodies cannot be obtained and the Q value becomes lowered. For these reasons, the content of $Al_2O_3$ has been limited to a value ranging from 1 to 15 mole %. If the content of $SiO_2$ is less than 8 mole %, the dielectric constant becomes large. If the content of $SiO_2$ exceeds 34 mole %, the Q value becomes considerably low. Thus, the content of $Si_2O_3$ has been limited to a value ranging from 8 to 34 mole %.

The addition of lithium oxide contributes to improve the electrical characteristics of the composition and makes it possible to produce microwave devices with higher Q value at high frequencies. The added amount of lithium oxide has been limited as being in the range of 0.1 to 10.0 weight % for the following reasons. If the amount of the lithium oxide is less than 0.1 weight %, the Q value is scarcely improved. If the amount of lithium oxide exceeds 10 weight %, the composition is apt to melt during sintering.

The dielectric ceramic composition for high frequencies of the present invention has a higher Q value and higher flexural strength than those of alumina ceramics, and has a low dielectric constant comparable to that of forsterite or steatite ceramics. Accordingly, the composition of the present invention makes it possible to manufacture high frequency circuit elements such a high Q resonant system, or microwave integrated circuits, with a high impedance and high reliability.

These and other objects, features and advantages of the present invention will be more apparent from the following description with respect to the several examples of the present invention.

EXAMPLE 1

Using MgO, Al$_2$O$_3$, SiO$_2$ and Li$_2$O as raw materials, there were prepared mixtures each having compositional proportions shown in Table 1. The resultant mixture was milled by the wet process for 2 hours, dehydrated, dried, calcined at 1100° C. for 2 hours, and then powdered. The resultant powder was granulated with a suitable amount of binder and then pressed into discs having a diameter of 18 mm and a thickness of 7 mm under a pressure of 2000 kg/cm$^2$. The discs were fired in air at a temperature ranging from 1400° to 1550° C. for 3 hours to prepare dielectric ceramic specimens.

For each specimen, dielectric characteristics in the frequency region from 8 to 10 GHz were measured in resonant circuits. The flexural strength was measured by the three point suspension method. Results are shown in Table 1.

Figure 1:
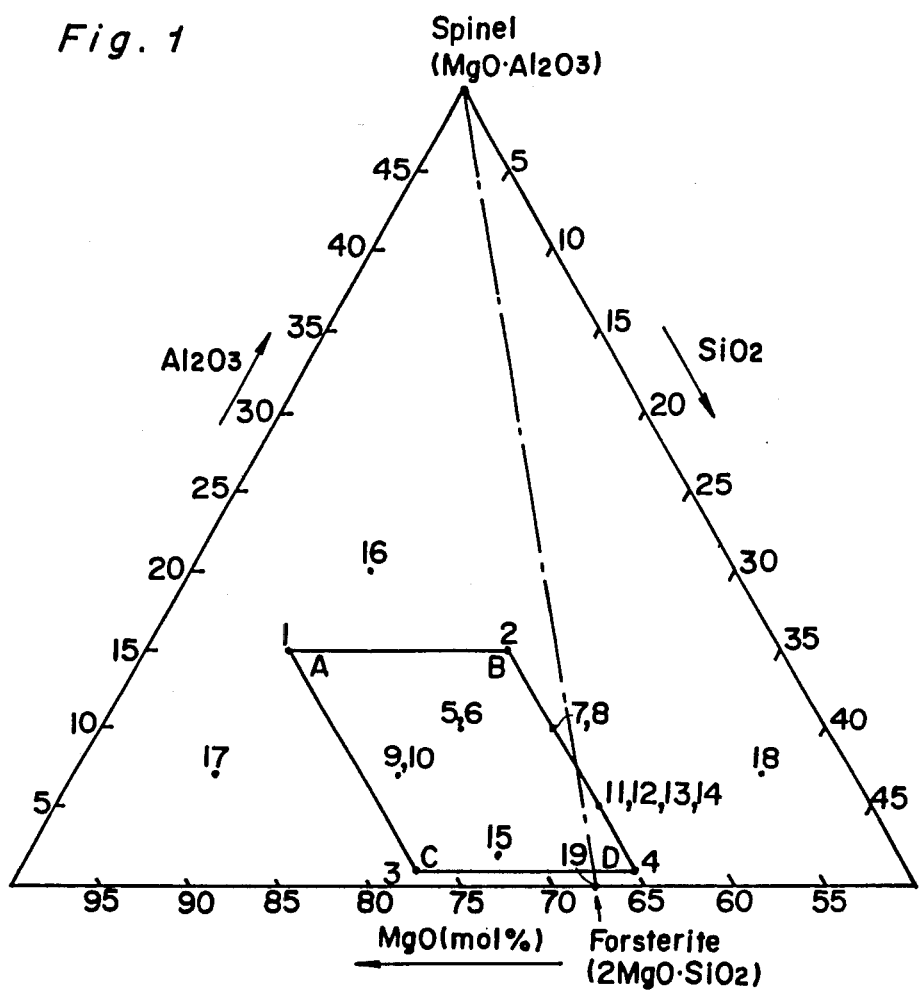
FIG. 1 is a ternary phase diagram showing a compositional area of a dielectric ceramic composition according to the present invention.
Figure 2:
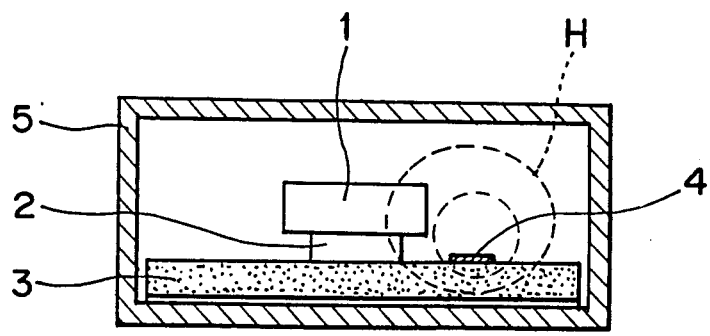
FIG. 2 is a schematic cross-sectional view of a microwave oscillator which comprises a dielectric resonator.

In Table 1, specimens with an asterisk (*) are those having a composition beyond the scope of the present invention, while other specimens are those included in the scope of the present invention. The specimen numbers are also shown in FIG. 1.

TABLE 1

| | composition | | | | | | Flexural |
|---|---|---|---|---|---|---|---|
| | basic composition | | | | | | Strength |
| No | MgO | Al$_2$O$_3$ (mole %) | SiO$_2$ | Li$_2$O (wt %) | ε | Q | (kg/cm$^2$) |
| 1 | 77 | 15 | 8 | 3 | 8.0 | 13100 | 2200 |
| 2 | 65 | 15 | 20 | 6 | 7.3 | 15200 | 2300 |
| 3 | 77 | 1 | 22 | 3 | 7.5 | 18200 | 2100 |
| 4 | 65 | 1 | 34 | 3 | 6.4 | 11400 | 2100 |
| 5* | 70 | 10 | 20 | 0 | 7.5 | 10500 | 2300 |
| 6 | 70 | 10 | 20 | 3 | 7.4 | 14300 | 2100 |
| 7* | 65 | 10 | 25 | 0 | 7.2 | 8700 | 2700 |
| 8 | 65 | 10 | 25 | 3 | 7.1 | 10400 | 2500 |
| 9* | 75 | 7 | 18 | 0 | 7.9 | 15300 | 2600 |
| 10 | 75 | 7 | 18 | 5 | 7.8 | 18900 | 2400 |
| 4* | 65 | 5 | 30 | 0 | 7.3 | 14300 | 2500 |
| 12 | 65 | 5 | 30 | 3 | 7.3 | 17500 | 2200 |
| 13 | 65 | 5 | 30 | 6 | 7.2 | 21300 | 2100 |
| 14* | 65 | 5 | 30 | 12 | | Melted | |
| 15 | 72 | 2 | 26 | 6 | 7.3 | 20900 | 2000 |
| 16* | 70 | 20 | 10 | 3 | | Can not be sintered | |
| 17* | 85 | 7 | 8 | 3 | 8.6 | 15200 | 1900 |
| 18* | 55 | 7 | 38 | 3 | 6.6 | 3700 | 1500 |
| 19* | 68 | 0 | 32 | 0 | 6.4 | 3000 | 1500 |

As can be seen from the results shown in Table 1, the dielectric ceramic composition according to the present invention has a low dielectric constant ranging from 6.4 to 8.0 and possesses a high Q value ranging from 10400 to 21300 at 10 GHz and a high flexural strength ranging from 2000 to 2400 which is higher than that of forsterite; 1500 kg/cm$^2$.

Figure 3:
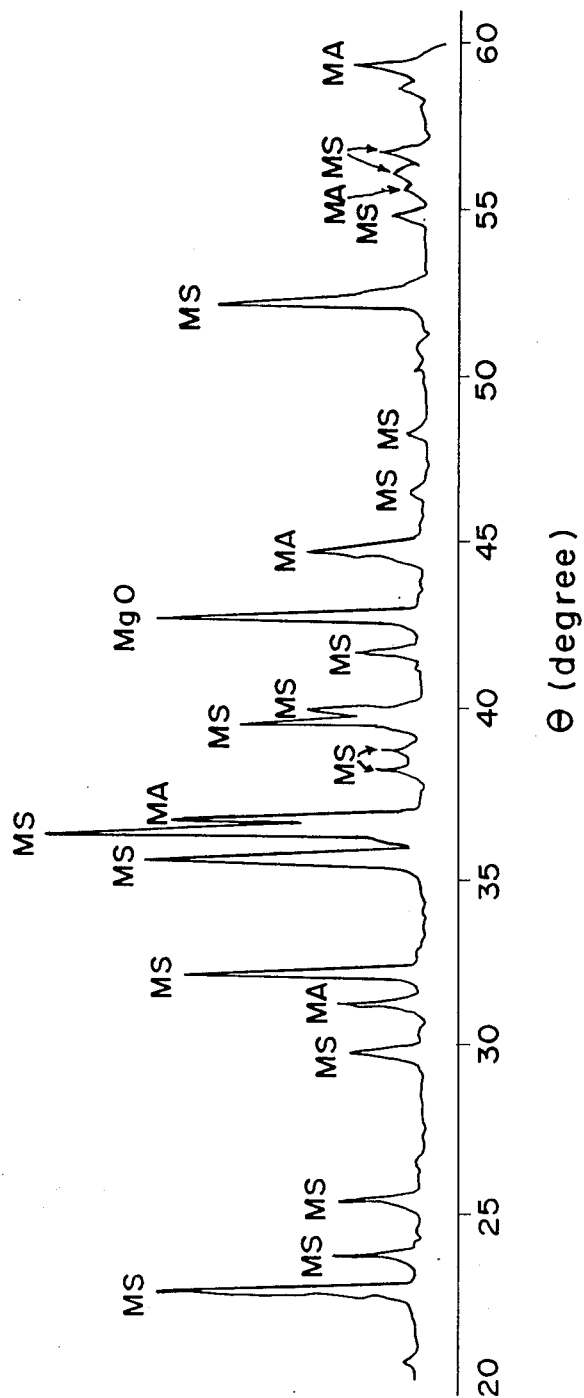
FIG. 3 is a graph showing an X-ray diffraction pattern of a dielectric ceramic composition of the present invention.

For the specimen No. 11, the crystal structure was determined by x-ray diffraction studies. As shown in FIG. 3, the composition of the present invention involves forsterite, spinel, and magnesium oxide. The composition of the present invention possesses a Q value much higher than that of forsterite; Q=3000, in spite of that the composition are mostly made up of the forsterite. The reasons is explained by the phase diagram of FIG. 4.

Figure 4:
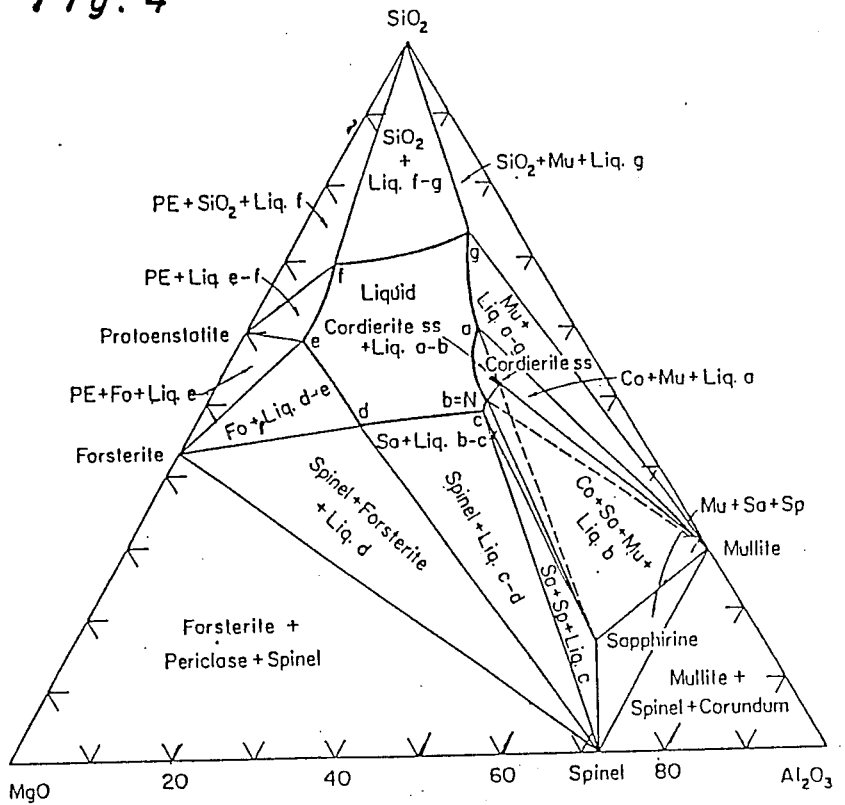
FIG. 4 is a phase diagram for a system MgO-Al$_2$O$_3$—SiO$_2$ showing isothermal section at 1460° C.

FIG. 4 is a phase diagram of a system MgO-Al$_2$O$_3$—SiO$_2$ reported by W. Schreyer and J. F. Schairer, J. Petrol, 2 [3] 361 (1961). In this figure, Cordierite (Co)=2MgO.2Al$_2$.5SiO$_2$, Forsterite (Fo)=2-MgO.SiO$_2$, Mullite (Mu)=3Al$_2$O$_3$ 2SiO$_2$, Protoenstatite (PE)=2MgO.SiO$_2$ and Sapphirine (Sa)=4MgO.-5Al$_2$O$_3$.5SiO$_2$, Spinel (Sp)=MgO.Al$_2$O$_3$, and Liquid=-Liq. As shown in this phase diagram, the sintering process is predominated by solid phase reaction on the left side of the line connecting spinel (Al$_2$O$_3$.SiO$_2$) and forsterite (2MgO.SiO$_2$), but predominated by liquid phase reaction on the right side. The liquid phase are apt to concentrate lattice imperfection, such as impurities or dislocations, to the crystal, and degrade Q value. As is shown in FIG. 1, the ceramics in the region of present invention are sintered within the region of solid phase sintering, while pure forsterite with Q of 3000 is sintered in liquid phase. This is the reason the compositions of this invention realize very high Q value.

As can be seen from the comparison of results for specimens Nos. 5 and 6, or 7 and 8, or 9 and 10 or 11 and 12, the Q value can be considerably improved by the incorporation of Li$_2$O into the basic composition.

What is claimed is:

1. A dielectric ceramic composition for high frequencies consisting essentially of a basic composition expressed by the general formula:

$$xMgO-yAl_2O_3-zSiO_2$$

wherein x, y and z are mole percentage of the respective components, $x+y+z=100$, $65 \leq x \leq 77$, $1 \leq y \leq 15$, and $8 \leq z \leq 34$, and an exclusive additive of 0.1 to 10.0 wt % $Li_2O$, said basic composition having a set of x, y and z falling within an area defined by a polygon ABCD encompassed by the points A, B, C and D in FIG. 1, the sets of x, y and z at the vertexes A, B, C and D of said polygon being as follows:

|   | x  | y  | z   |
|---|----|----|-----|
| A | 77 | 15 | 8   |
| B | 65 | 15 | 20  |
| C | 77 | 1  | 22  |
| D | 65 | 1  | 34. |

* * * * *